(12) United States Patent
Masuda

(10) Patent No.: US 9,466,506 B2
(45) Date of Patent: Oct. 11, 2016

(54) SUBSTRATE PROCESSING SYSTEM, GAS SUPPLY UNIT, METHOD OF SUBSTRATE PROCESSING, COMPUTER PROGRAM, AND STORAGE MEDIUM

(71) Applicant: TOKYO ELECTRON LIMITED, Tokyo (JP)

(72) Inventor: Noriiki Masuda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 954 days.

(21) Appl. No.: 13/705,336

(22) Filed: Dec. 5, 2012

(65) Prior Publication Data

US 2013/0149867 A1    Jun. 13, 2013

Related U.S. Application Data

(62) Division of application No. 11/889,584, filed on Aug. 14, 2007, now abandoned.

(60) Provisional application No. 60/875,538, filed on Dec. 19, 2006.

(30) Foreign Application Priority Data

Aug. 15, 2006 (JP) .................... 2006-221675

(51) Int. Cl.
*H01L 21/308* (2006.01)
*H01J 37/32* (2006.01)
*H01L 21/311* (2006.01)

(52) U.S. Cl.
CPC ....... *H01L 21/3086* (2013.01); *H01J 37/3244* (2013.01); *H01J 37/32449* (2013.01); *H01L 21/31116* (2013.01)

(58) Field of Classification Search
None
See application file for complete search history.

(56) References Cited

U.S. PATENT DOCUMENTS 5,500,256 A    3/1996  Watabe
5,589,002 A   12/1996  Su
(Continued)

FOREIGN PATENT DOCUMENTS

JP    07-142449    6/1995
JP    2000-28996   2/2000
(Continued)

OTHER PUBLICATIONS

Japanese Office Action issued on Mar. 6, 2012 for Application No. 2006-221675 w/ English translation.

*Primary Examiner* — Allan Olsen
(74) *Attorney, Agent, or Firm* — Smith, Gambrell & Russell, LLP.

(57) ABSTRACT

The present invention is to provide a technique for uniformly processing a substrate surface in the process of processing a substrate by supplying a gas. The inside of a shower head having gas-jetting pores for supplying a gas to a substrate is partitioned into a center section from which a gas is supplied to the center portion of a substrate, and a peripheral section from which a gas is supplied to the peripheral portion of the substrate, and the same process gas is supplied to the substrate from these two sections at flow rates separately regulated. The distance from the center of the center section of the gas supply unit to the outermost gas-jetting pores in the center section is set 53% or more of the radius of the substrate. Moreover, an additional gas is further supplied to the peripheral portion of the substrate.

7 Claims, 11 Drawing Sheets

(56) References Cited

U.S. PATENT DOCUMENTS

| | | | |
|---|---|---|---|
| 5,605,637 A * | 2/1997 | Shan | H01J 37/32477 118/723 E |
| 5,877,090 A | 3/1999 | Padmapani et al. | |
| 5,958,140 A | 9/1999 | Arami et al. | |
| 6,009,830 A | 1/2000 | Li et al. | |
| 6,397,861 B1 | 6/2002 | Wing et al. | |
| 6,444,039 B1 | 9/2002 | Nguyen | |
| 6,500,357 B1 * | 12/2002 | Luo | H01L 21/31116 216/41 |
| 6,537,419 B1 | 3/2003 | Kinnard | |
| 6,544,429 B1 * | 4/2003 | Hung | H01L 21/31116 216/67 |
| 6,642,153 B1 * | 11/2003 | Chang | B08B 7/00 134/1.1 |
| 6,800,139 B1 | 10/2004 | Shinriki et al. | |
| 2002/0132486 A1 * | 9/2002 | Williams | H01L 21/3065 438/712 |
| 2003/0045116 A1 * | 3/2003 | Wang | H01L 21/41116 438/710 |
| 2005/0005994 A1 * | 1/2005 | Sugiyama | G05D 7/0664 141/4 |
| 2005/0011859 A1 * | 1/2005 | Ji | H01L 21/31116 216/20 |
| 2005/0029369 A1 | 2/2005 | Nagaoka et al. | |
| 2005/0034674 A1 | 2/2005 | Ono | |
| 2005/0282395 A1 * | 12/2005 | Chang | H01L 21/0276 438/740 |
| 2006/0016559 A1 | 1/2006 | Kobayashi et al. | |
| 2006/0124169 A1 | 6/2006 | Mizusawa et al. | |
| 2007/0175391 A1 * | 8/2007 | Mizusawa | C23C 16/455 118/689 |
| 2007/0181181 A1 * | 8/2007 | Mizusawa | C23C 16/45565 137/1 |
| 2007/0251642 A1 | 11/2007 | Bera et al. | |

FOREIGN PATENT DOCUMENTS

| | | |
|---|---|---|
| JP | 2002-502553 | 1/2002 |
| JP | 2002-155366 | 5/2002 |
| JP | 2002-261036 | 9/2002 |
| JP | 2005-723 | 1/2005 |
| JP | 2006-041088 | 2/2006 |
| JP | 2006-165399 | 6/2006 |

* cited by examiner

SUBSTRATE PROCESSING SYSTEM, GAS SUPPLY UNIT, METHOD OF SUBSTRATE PROCESSING, COMPUTER PROGRAM, AND STORAGE MEDIUM

CROSS REFERENCE TO RELATED APPLICATION

This application is a division of Ser. No. 11/889,584 filed Aug. 14, 2007, which is being incorporated in its entirety herein by reference.

The present application for patent enjoys the benefit of the right to Japanese Patent Application No. 2006-221675 filed on Aug. 15, 2006 and U.S. Patent Provisional Application No. 60/875,538 filed on Dec. 19, 2006. The whole description in the aforesaid applications is incorporated herein by reference.

BACKGROUND OF THE INVENTION

1. Field of the Invention

The present invention relates to a technique for processing a substrate, such as a semiconductor wafer, by supplying gases to it, and to a unit for supplying the gases.

2. Background Art

In semiconductor device production processes, processing of a substrate such as a semiconductor wafer (hereinafter referred to as a wafer), e.g., etching or CVD, is conducted by placing a substrate in a processing vessel, and injecting, onto the substrate, process gases from a gas supply unit called a gas shower head, set in parallel with the substrate.

On the other hand, the recent trend toward small-sized, higher-density patterns has brought to some processes such a problem that patterns formed on substrate surfaces by the processes are apt to be non-uniform in size. For example, in a process of making a line-shaped gate electrode for a transistor by etching a gate electrode material layer covered with a resist mask, it is not easy to ensure a high selective etching ratio, and the resist mask disappears before the etching of the gate electrode material layer has been completed. For this reason, a technique for etching a gate electrode material layer by the use of silicon nitride film (SiN film) as a hard mask is now examined.

However, lines made in SiN film by etching have such a strong tendency that a curve of the within-film distribution of the line widths is convex. In other words, the line widths tend to be greater in the center of the film than at the edge. Since a depositing material is easily deposited on SiN film, the non-uniformity of depositing gas distribution on a substrate surface readily affects the amount of a material to be deposited on the sides of the lines. On the other hand, since it is more difficult to exhaust a gas from the center of a wafer than from the edge, and the gas pressure is slightly higher in the center of a wafer than at the edge, the amount of the deposit is greater in the center of a wafer than at the edge, and this difference in the amount of the deposit is considered to affect the within-wafer distribution of line widths greatly.

For example, in the process of etching SiN film 103 lying under a photoresist mask 101 and $SiO_2$ film 102, as shown in FIG. 11(a), by the use of a plasma of a process gas containing, for example, $CH_2F_2$ gas serving as a depositing gas and oxygen gas serving as an etching gas, as shown in FIG. 11(b), permissible variations in line size D are in the range of 10 nm or less. Lines not only in a high-line-density area of a wafer 100, e.g., an area in which the ratio of metal lines to insulating layers between them is about 1:1, but also in a low-line-density area of a wafer 100 that has so far been allowed to have relatively large variations in line size D, e.g., an area in which the above-described ratio is 1:2 or more, are required to have sizes D that fall in the above-described range of permissible variations.

The gas supply unit described in Patent Document 1 can supply a gas to the center and edge of a wafer separately, so that it is possible to make the depositing gas feed rate per unit area greater at the edge of the wafer than in the center. However, since the flow rate of an etching gas to be supplied to the edge of the wafer also becomes higher, even if a film is deposited in an increased amount, the film is etched in an increased amount. Roughly speaking, therefore, it is impossible to increase the amount of the deposit at the edge of the wafer, and also to improve the within-wafer distribution of line sizes.

Patent Document 1: Japanese Patent Laid-Open Publication No. 2005-723 ((0052)-(0054)) (U.S. Patent No. 2005-29369)

SUMMARY OF THE INVENTION

The present invention was accomplished under these circumstances. An object of the invention is to provide a technique for uniformly processing a substrate surface in the process of processing a substrate by supplying gases to it.

The present invention is a substrate processing system comprising a processing vessel; a table that is placed in the processing vessel and on which a substrate will be placed; a gas supply unit set on the top of the processing vessel facing the table, including a center section that corresponds to the center portion of the substrate and has a large number of gas-jetting pores, and a peripheral section that corresponds to the peripheral portion of the substrate and has a large number of gas-jetting pores; a first-gas supply means of supplying a common gas to the center and peripheral sections of the gas supply unit at flow rates separately regulated; a second-gas supply means of supplying an additional gas, in addition to the common gas, to the peripheral section of the gas supply unit; and a means of evacuating the processing vessel, the distance from the center of the center section of the gas supply unit to the outermost gas-jetting pores in the center section being 53% or more of the radius of the substrate.

A preferred embodiment of the present invention is the substrate processing system in which the first-gas supply means has a plurality of gas supply sources for supplying different gases, a plurality of gases supplied from a plurality of the gas supply sources are mixed, and the gas mixture is divided into two streams and supplied as the common gas to the center and peripheral sections separately.

A preferred embodiment of the present invention is the substrate processing system in which the common gas contains an etching gas and a gas having the property of depositing on the substrate or of protecting the side faces of projections on the substrate, the ratio of the flow rate of the former gas to that of the latter gas in the center section being the same as said ratio in the peripheral section, and the additional gas has the property of depositing on the substrate or of protecting the side faces of projections on the substrate.

A preferred embodiment of the present invention is the substrate processing system in which the additional gas having the property of depositing on the substrate is a gas of a compound containing carbon and hydrogen.

A preferred embodiment of the present invention is the substrate processing system in which the etching gas is for etching silicon nitride film on the substrate.

A preferred embodiment of the present invention is the substrate processing system in which the etching gas is for etching silicon nitride film on the substrate, and the additional gas having the property of protecting the side faces of projections is nitrogen gas.

A preferred embodiment of the present invention is the substrate processing system useful for making lines in a thin film on the substrate by etching.

A preferred embodiment of the present invention is the substrate processing system in which the pressure at which the substrate is processed in the processing vessel is regulated to 1.3-40 Pa.

The present invention is a gas supply unit set on a processing vessel in which a substrate is placed, including a center section that corresponds to the center portion of the substrate and has a large number of gas-jetting pores, and a peripheral section that corresponds to the peripheral portion of the substrate and has a large number of gas-jetting pores, a common gas being supplied to the center and peripheral sections of the gas supply unit at flow rates separately regulated, an additional gas being supplied, in addition to the common gas, to the peripheral section of the gas supply unit, the distance from the center of the center section of the gas supply unit to the outermost gas-jetting pores in the center section being 53% or more of the radius of the substrate.

A preferred embodiment of the present invention is the gas supply unit in which a plurality of gases supplied from a plurality of gas supply sources for supplying different gases are mixed, and the gas mixture is divided into two streams and supplied as the common gas to the center and peripheral sections separately.

A preferred embodiment of the present invention is the gas supply unit in which the common gas contains an etching gas and a gas having the property of depositing on the substrate or of protecting the side faces of projections on the substrate, the ratio of the flow rate of the former gas to that of the latter gas in the center section being the same as said ratio in the peripheral section, and the additional gas has the property of depositing on the substrate or of protecting the sides of projections on the substrate.

The present invention is a method of processing a substrate by the use of a substrate processing system comprising a processing vessel; a table that is placed in the processing vessel and on which a substrate will be placed; a gas supply unit set on the top of the processing vessel facing the table, including a center section that corresponds to the center portion of the substrate and has a large number of gas-jetting pores, and a peripheral section that corresponds to the peripheral portion of the substrate and has a large number of gas-jetting pores; a first-gas supply means of supplying a common gas to the center and peripheral sections of the gas supply unit at flow rates separately regulated; a second-gas supply means of supplying an additional gas, in addition to the common gas, to the peripheral section of the gas supply unit; and a means of evacuating the processing vessel, the method comprising the steps of supplying to the substrate from the center and peripheral sections of the gas supply unit the common process gas that has been supplied to the two sections by the first-gas supply means at flow rates separately regulated, supplying, in addition to the common process gas, the additional gas that has been supplied to the peripheral section of the gas supply unit by the second-gas supply means, to the substrate from the peripheral section, and evacuating the processing vessel with the means of evacuating the processing vessel, the distance from the center of the center section of the gas supply unit to the outermost gas-jetting pores in the center section being 53% or more of the radius of the substrate.

A preferred embodiment of the present invention is the method of substrate processing in which the first-gas supply means has a plurality of gas supply sources for supplying different gases, and the step of supplying the common gas to the substrate from the center and peripheral sections of the gas supply unit is a step in which a plurality of gases supplied from a plurality of the gas supply sources are mixed, and the gas mixture is divided into two streams and supplied as the common gas to the center and peripheral sections separately.

A preferred embodiment of the present invention is the method of substrate processing in which the common gas contains an etching gas and a gas having the property of depositing on the substrate or of protecting the side faces of projections on the substrate, the ratio of the flow rate of the former gas to that of the latter gas in the center section being the same as said ratio in the peripheral section, and the additional gas has the property of depositing on the substrate or of protecting the side faces of projections on the substrate.

A preferred embodiment of the present invention is the method of substrate processing in which the additional gas having the property of depositing on the substrate is a gas of a compound containing carbon and hydrogen.

A preferred embodiment of the present invention is the method of substrate processing in which the etching gas is for etching silicon nitride film on the substrate.

A preferred embodiment of the present invention is the method of substrate processing in which the etching gas is for etching silicon nitride film on the substrate, and the additional gas having the property of protecting the side faces of projections is nitrogen gas.

A preferred embodiment of the present invention is the method of substrate processing for making lines in a thin film on the substrate by etching.

A preferred embodiment of the present invention is the method of substrate processing in which the pressure at which the substrate is processed in the processing vessel is regulated to 1.3-40 Pa.

The present invention is a computer program for allowing a computer to perform a method of substrate processing, the method of substrate processing being for processing a substrate by the use of a substrate processing system comprising a processing vessel; a table that is placed in the processing vessel and on which a substrate will be placed; a gas supply unit set on the top of the processing vessel facing the table, including a center section that corresponds to the center portion of the substrate and has a large number of gas-jetting pores, and a peripheral section that corresponds to the peripheral portion of the substrate and has a large number of gas-jetting pores; a first-gas supply means of supplying a common gas to the center and peripheral sections of the gas supply unit at flow rates separately regulated; a second-gas supply means of supplying an additional gas, in addition to the common gas, to the peripheral section of the gas supply unit; and a means of evacuating the processing vessel, the method comprising the steps of supplying to the substrate from the center and peripheral sections of the gas supply unit the common process gas that has been supplied to the two sections by the first-gas supply means at flow rates separately regulated, supplying, in addition to the common process gas, the additional gas that has been supplied to the peripheral section of the gas supply unit by the second-gas supply means, to the substrate from the peripheral section, and evacuating the processing vessel with the means of evacuating the processing vessel, the distance from the center of the center section of the gas supply unit to the outermost gas-jetting pores in the center section being 53% or more of the radius of the substrate.

The present invention is a storage medium in which a computer program for allowing a computer to perform a method of substrate processing is stored, the method of substrate processing being for processing a substrate by the use of a substrate processing system comprising a processing vessel; a table that is placed in the processing vessel and on which a substrate will be placed; a gas supply unit set on the top of the processing vessel facing the table, including a center section that corresponds to the center portion of the substrate and has a large number of gas-jetting pores, and a peripheral section that corresponds to the peripheral portion of the substrate and has a large number of gas-jetting pores; a first-gas supply means of supplying a common gas to the center and peripheral sections of the gas supply unit at flow rates separately regulated; a second-gas supply means of supplying an additional gas, in addition to the common gas, to the peripheral section of the gas supply unit; and a means of evacuating the processing vessel, the method comprising the steps of supplying to the substrate from the center and peripheral sections of the gas supply unit the common process gas that has been supplied to the two sections by the first-gas supply means at flow rates separately regulated, supplying, in addition to the common process gas, the additional gas that has been supplied to the peripheral section of the gas supply unit by the second-gas supply means, to the substrate from the peripheral section, and evacuating the processing vessel with the means of evacuating the processing vessel, the distance from the center of the center section of the gas supply unit to the outermost gas-jetting pores in the center section being 53% or more of the radius of the substrate.

According to the present invention, in the gas supply unit that supplies, to a substrate, from its center and peripheral sections having a large number of gas-jetting pores, a common process gas separately is used, and an additional gas is further supplied to the substrate from the peripheral section. Moreover, the gas supply unit is partitioned into a center section and a peripheral section at an optimized position. It is therefore possible to decrease the within-substrate non-uniformity in processing that is brought about because it is more difficult to evacuate the center portion of the substrate than the peripheral portion. It is thus possible to improve the within-substrate uniformity in processing, e.g., in etching.

For example, such a pattern as a line pattern formed, by etching, in a film on which a material is easily deposited, such as silicon nitride film, is apt to be smaller in width in the peripheral portion of the film. The within-film uniformity in pattern width can be improved by additionally supplying, to the peripheral portion of a film, a gas having the property of depositing on the film or of protecting the side faces of non-etched portions of (protrusions on) the film.

BEST MODE FOR CARRYING OUT THE INVENTION

Figure 1:
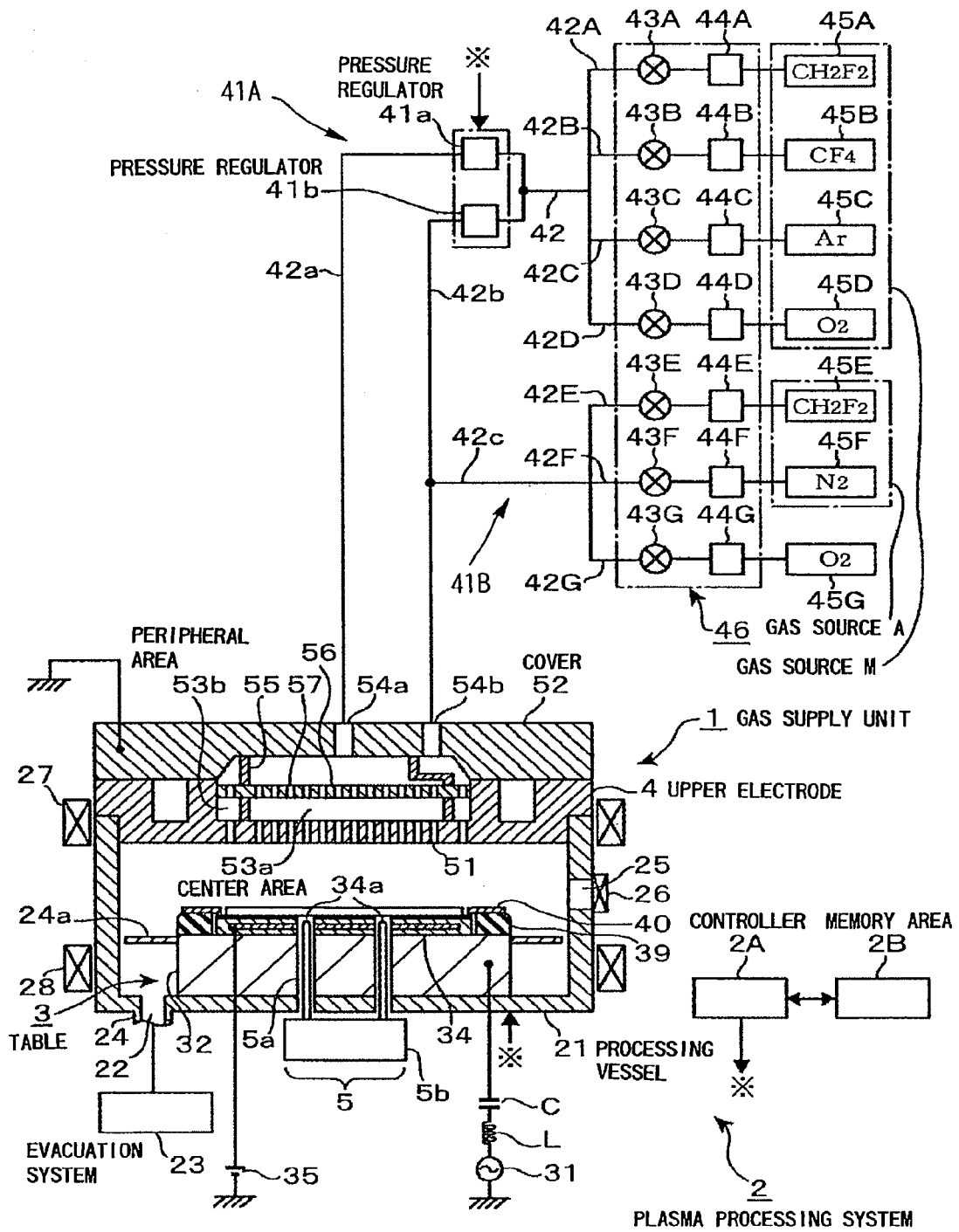
FIG. 1 is a longitudinal sectional view of a plasma processing system to which a gas supply unit of the present invention is applied.
Figure 2:
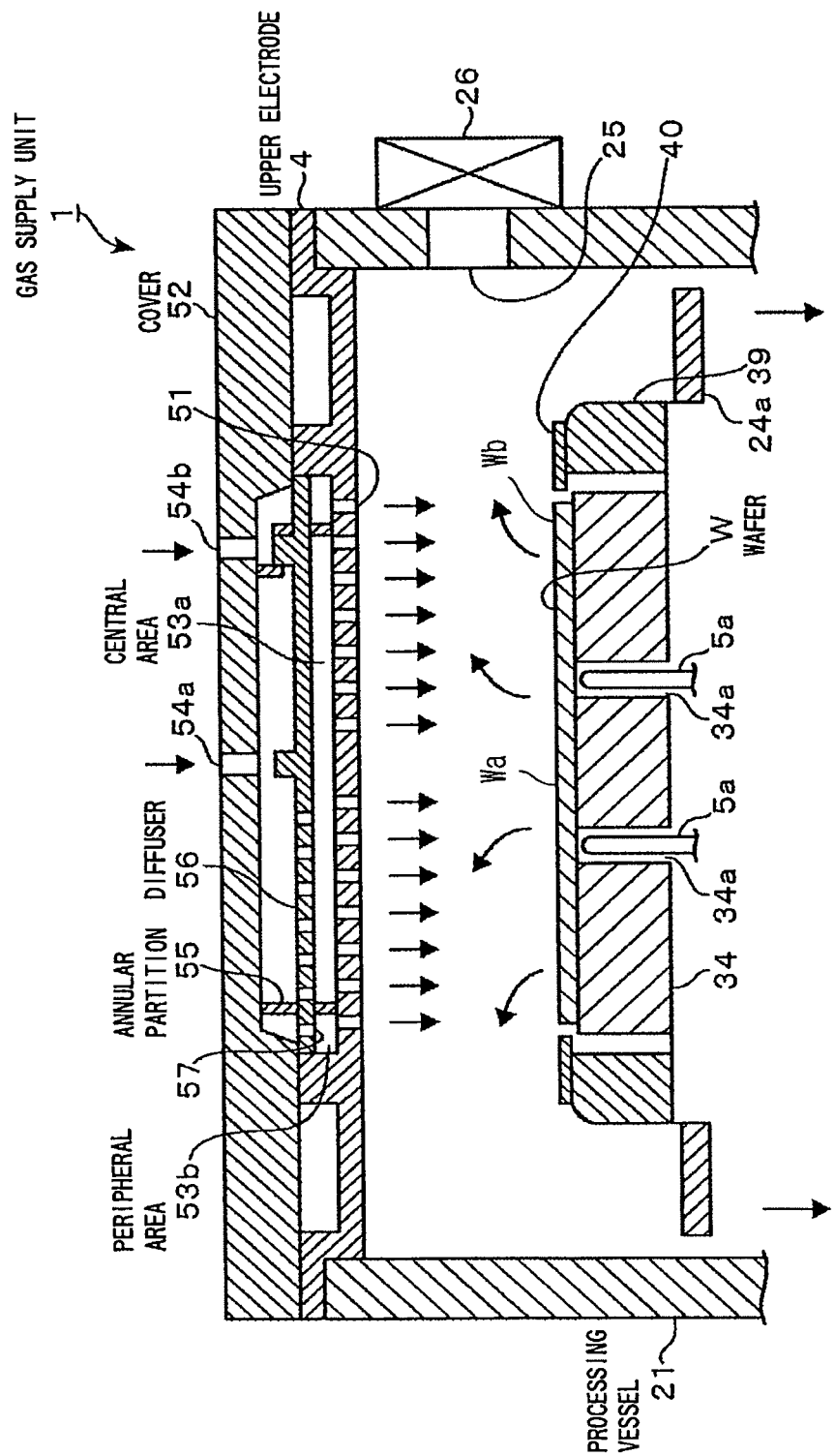
FIG. 2 is a sectional view of a processing vessel 21 in the above plasma processing system 2.

An example of the application of a gas supply unit 1 of the present invention will be described hereinafter with reference to FIGS. 1 to 3. A plasma processing system 2 to which a gas supply unit 1 of the invention is applied comprises a processing vessel 21 composed of e.g., a vacuum chamber having a closed internal space, a table 3 serving also as a lower electrode, set in the center of the bottom of the processing vessel 21 so that a wafer (substrate) can be placed on it, and an upper electrode 4 that is a part of a shower head set above and in parallel with the table 3.

The processing vessel 21 has an exhaust hole 22 in its bottom, and this exhaust hole 22 communicates with an evacuation system 23, a means of evacuating the processing vessel 21, via an exhaust pipe 24. The evacuation system 23 is provided with a pressure regulator not shown in the figure. Owing to the pressure regulator, the evacuation system 23 evacuates the processing vessel 21 to the desired degree of vacuum in response to signals from a controller 2A that will be described later and keeps the processing vessel 21 at this degree of evacuation. The processing vessel 21 has, in its sidewall, a gate 25 through which a wafer W is carried in or out, and this gate 25 can be opened or closed by operating a gate valve 26. Annular permanent magnets 27, 28 are put around the periphery of the processing vessel 21 in positions above and below the gate 25, respectively.

A deposit shield is laid on the inner wall of the processing vessel 21 so that the inner wall is held at a high temperature, e.g., 60° C. or more, to prevent such a material as fluorocarbon from depositing on it. The deposit shield, however, is omitted from the figure.

The table 3 is composed of a support 32 made of e.g., aluminum, an electrostatic chuck 34, a first ring 39 made from an insulator, surrounding the electrostatic chuck 34 with a slight gap between them, and a second ring 40 made from an electrically conductive material, which is placed on the upper face of the first ring 39 and acts to spread horizontally a plasma produced above the wafer W. The electrostatic chuck 34 has through holes 34a, which are necessary to elevate the wafer W, as will be described later. Further, a high-voltage D.C. power supply 35 is connected to the electrostatic chuck 34, and the electrostatic chuck 34 electrostatically adsorbs a wafer W when power is supplied by the high-voltage D.C. power supply 35.

To the sidewall of the table 3, an annular exhaust ring 24a serving as an exhaust buffer is attached so that it fills up the annular gap between the table 3 and the inner wall of the processing vessel 21. This exhaust ring 24a is for making the circumferential rate of exhaust uniform, thereby making the rate of exhaust from the circumference of a wafer W placed on the table 3 uniform.

To the support 32 of the table 3 is connected an RF generator 31 for generating a high-frequency wave of e.g., 13.56 MHz, via a condenser C and a coil L. The RF generator is for producing plasmas from process gases. It is connected to a controller 2A, which will be described later, and electric power to be supplied to the RF generator 31 is controlled according to control signals from the controller 2A. The RF generator 31 and the table 3 constitute a means of generating plasmas.

Inside the table 3 is an elevating member 5 of delivering a wafer W from the table 3 to a carrier arm that is present outside the processing vessel 21, though not shown in the figure, and vice versa. The elevating member 5 is composed of a plurality of, e.g., three, elevating pins 5a penetrating the table 3 and the bottom of the processing vessel 21, a driving mechanism 5b for driving these elevating pins 5a, and so forth. By means of the driving mechanism 5b, the tips of the elevating pins 5a are raised above and downed into the through holes 34a made in the electrostatic chuck 34.

The upper electrode 4 and a cover 52 placed on it constitute a nearly disc-shaped gas shower head, a gas supply unit 1. The cover 52 is grounded. The space facing the table 3, enclosed by the upper electrode 4 and the cover 52 is partitioned by an annular partition 55 into a center section 53a corresponding to the center portion Wa of a wafer W and an edge section (peripheral section) 53b corresponding to the edge portion (peripheral portion) Wb of the wafer W. The center section 53a and the edge section (peripheral section) 53b have a gas supply port 54a and a gas supply port 54b, respectively, so that a first gas and a second gas, which will be described later, pass through the respective ports. Although only one gas supply port 54b is made in the cover 52 in this example, two or more gas supply ports 54b may also be circumferentially made in the cover 52 at regular intervals.

Figure 3:
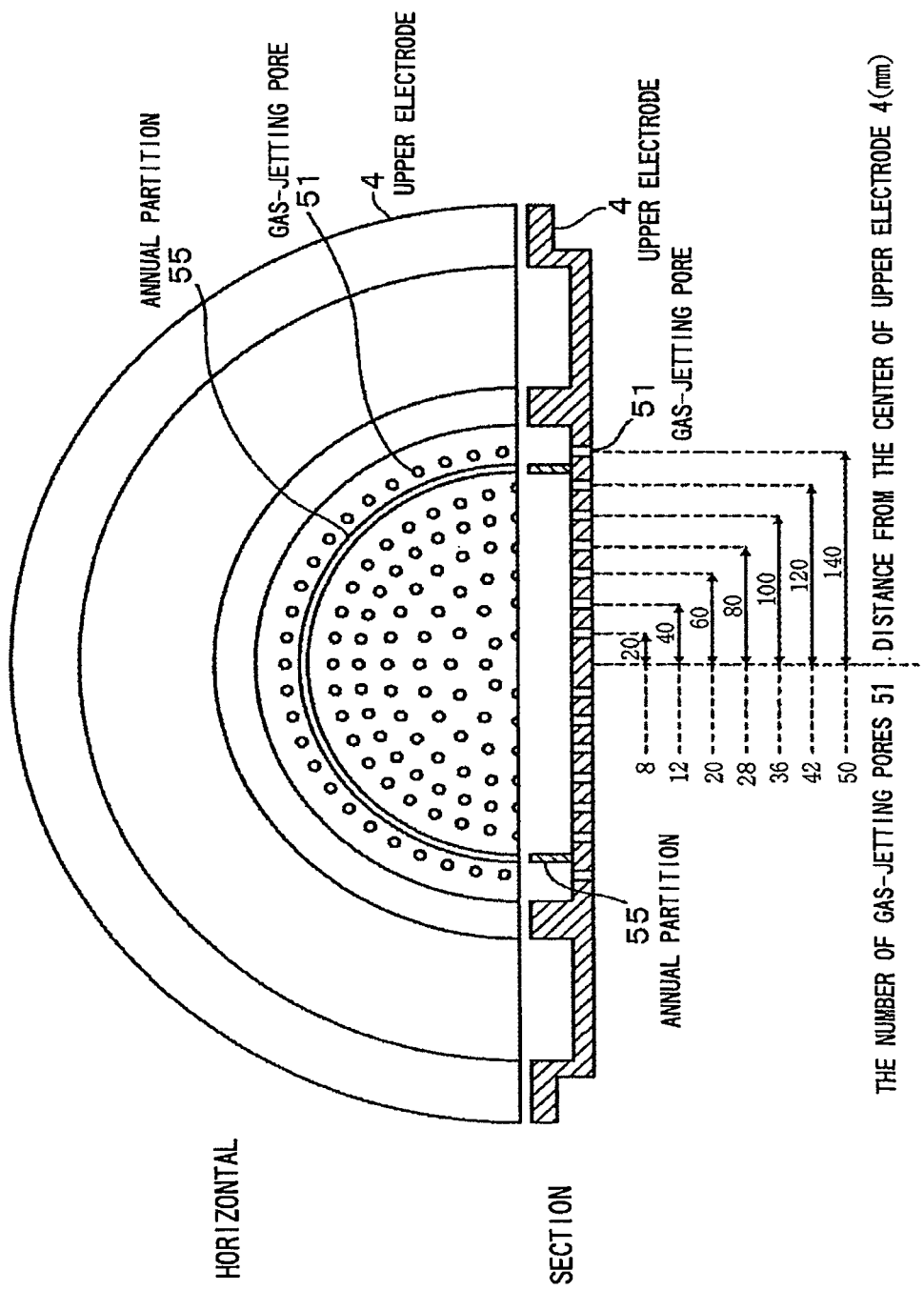
FIG. 3 is a view showing an upper electrode 4 in the above plasma processing system 2.

As shown in FIG. 3, the upper electrode 4 has a large number of gas-jetting pores 51 for dispersively feeding a process gas to a wafer W. These gas-jetting pores 51 are made in e.g., seven circular rows concentric with the wafer W so that 8, 12, 20, 28, 36, 42, and 50 pores are on the circumferences of concentric circles with radii of 20 mm, 40 mm, 60 mm, 80 mm, 100 mm, 120 mm, and 140 mm, respectively. These gas-jetting pores 51 are grouped by the above-described partition 55 into the gas-jetting pores 51 communicating with the nearly circular center section 53a, and the gas-jetting pores 51 communicating with the nearly annular edge section 53b.

In this example, the partition 55 is positioned so that the distance from the center of the center section 53a to the outermost row of the gas-jetting pores 51 in the center section 53a (the radius RO of the outermost circle of the gas-jetting pores 51 in the center section 53a) is 80% of the radius of the wafer W. Namely, in processing a wafer W with a diameter of 300 mm, the partition 55 is placed in a position 130 mm apart from the center of the upper electrode 4; a first gas is supplied to the center portion of the wafer W from the gas-jetting pores 51 on the circumferences of six circles on the center side, and a second gas, to the edge portion of the wafer from the gas-jetting pores 51 on the circumference of the remaining one circle on the edge side. In this case, the above-described radius RO is 120 mm, so that the percentage of the radius RO to the radius of the wafer W is 80%. By altering the position of the partition 55, the center section 53a and the edge section 53b can be varied in size. This means that it is possible to vary the area of the center portion of a wafer W to which the first gas is supplied, and that of the edge portion of the wafer W to which the second gas is supplied.

Although the gas-jetting pores 51 are disposed concentrically with the wafer W in this example, they may also be disposed in a grid or zigzag pattern.

The space between the upper electrode 4 and the cover 52 is partitioned into upper and lower sections by a disc-shaped diffuser 56. The diffuser 56 has gas-flowing pores 57 made, for example, in circular rows concentric with a wafer W, corresponding to the concentric circles of the gas-jetting pores 51. The positions of the gas-flowing pores 57 are shifted from those of the gas-jetting pores 51 by e.g., 10 mm so that the stream of a gas flowing in the space above the diffuser 56 is diffused, thereby making the distribution of the gas to be jetted from the center section 53a and that of the gas to be jetted from the edge section 53b uniform. Further, the diffuser 56 has projections on it in the positions corresponding to the gas supply ports 54a, 54b, so that a gas supplied to the center section 53a and a gas supplied to the edge section 53b are dispersed. The above-described partition 55 is divided into upper and lower parts by the diffuser 56, but these two parts extend upwardly and downwardly from one point on the diffuser 56 and constitute the partition 55.

As mentioned above, the gas supply ports 54a, 54b are made in the upper surface of the cover 52 so that they communicate with the center section 53a and the edge section 53b, respectively. The gas supply ports 54a, 54b communicate, via gas feed pipes 42a, 42b, with pressure regulators 41a, 41b that are means of regulating the flow rates of gases to be supplied to the center section 53a and the edge section 53b, respectively. On the upstream side of the pressure regulators 41a, 41b, the gas feed pipes 42a, 42b join a gas feed pipe 42. The gas feed pipe 42 is branched, on its upstream side, into four branch pipes 42A to 42D. The branch pipes 42A to 42D communicate with gas supply sources 45A to 45D, which constitute a gas supply source M, via valves 43A to 43D and flow rate controllers 44A to 44D, respectively. A common gas is supplied from the gas source M to the pressure regulators 41a, 41b, and a controller 2A, which will be described later, controls the pressures of the pressure regulators 41a, 41b to regulate separately the flow rate of the gas to be supplied to the center section 53a and that of the gas to be supplied to the edge section 53b. The common gas herein means that, in the case where a gas mixture of two or more process gases is supplied to the center section 53a and to the edge section 53b, the gas mixture to be supplied to the center section 53a and the one to be supplied to the edge section 53b are the same in the ratio at which the process gases are mixed. For example, this means that an etching gas and a depositing gas that are supplied to the center section 53a and the ones that are supplied to the edge section 53b are identical in the ratio of the flow rate of the etching gas to that of the depositing gas.

The gas source M, the flow rate controllers 44A to 44D, the valves 43A to 43D, the branch pipes 42A to 42D, the gas feed pipe 42, the pressure regulator 41a, and the gas feed pipe 42a constitute a means for supplying a common gas to the center section 53a. On the other hand, the gas source M, the flow rate controllers 44A to 44D, the valves 43A to 43D, the branch pipes 42A to 42D, the gas feed pipe 42, the pressure regulator 41b, and the gas feed pipe 42b constitute a means for supplying a common gas to the edge section 53b. These means for supplying a common gas to the center section 53a and the edge section 53b constitute a first-gas supply means 40A.

On the other hand, a gas feed pipe 42c is connected to the above-described gas feed pipe 42b at a point between the gas feed port 54b and the pressure regulator 41b. The gas feed pipe 42c is branched, on its upstream side, into three branch pipes 42E, 42F, 42G, which communicate with gas supply sources 45E, 45F constituting a gas source A and also with a gas supply source 45G, via valves 43E, 43F, 43G and flow rate controllers 44E, 44F, 44G, respectively. A gas supplied from the gas source A is added to the gas that has been supplied from the gas source M and is flowing in the above-described gas feed pipe 42b. This gas has the property of protecting openings 77 in a photoresist mask 71, which will be described later, as well as the inner walls of cavities 78 formed in films lying under the photoresist mask 71. The gas source A, the flow rate controllers 44E, 44F, the valves 43E, 43F, the branch pipes 42E, 42F, and the gas feed pipe 42c constitute a means for supplying an additional gas to the edge section 53b. The means for supplying an additional gas to the edge section 53b is a second-gas supply means 40B.

The valves 43A to 43G and the flow rate controllers 44A to 44G constitute a gas supply system 46, with which the flow rates of gases supplied from the gas supply sources 45A to 45G, the supply and stoppage of these gasses, and the pressures of gases flowing in the gas feed pipes 42a, 42b are controlled according to control signals from the controller 2A, which will be described later. Namely, as will be described later, in order to decrease variations in wafer W processing, the flow rate of a second gas to be supplied to the edge portion of the wafer W and that of a first gas to be supplied to the center portion of the wafer W are regulated, and a gas from the gas source A is added to the second gas. A gas that flows in the gas feed pipe 42a and a gas that flows in the gas feed pipe 42b are the first gas and the second gas, respectively.

This plasma processing system 2 is provided with the controller 2A composed of a computer, for example. The controller 2A comprises a program, a memory, and a data processor composed of a CPU. The program contains commands to the controller 2A to send control signals to various parts of the plasma processing system 2 to carry out the steps that will be described later, thereby plasma-processing a wafer W. The memory has an area in which the process parameters such as process pressure, process time, gas flow rate, and power value are written, and when the CPU executes each command in the program, these process parameters are read out, and control signals corresponding to the parameter values are sent to the respective parts of the plasma processing system 2. This program (including programs concerning the input operation and display of the process parameters) is stored in a memory area 2B of a computer storage medium such as a flexible disc, a compact disc, an MO (magneto-optical disc), or a hard disc (HD), and is installed in the controller 2A.

Next, an embodiment of the present invention, using the plasma processing system 2 to which the gas supply unit 1 is applied, will be described. The gate valve 26 is first opened, and a wafer W with a diameter of 300 mm (12 inches) is carried in the processing vessel 21 through the gate 25 by a wafer-transferring mechanism that is not shown in the figure. After placing the wafer W on the table 3 by means of the elevating member 5, the table 3 is allowed to adsorb the wafer W electrostatically. The wafer-transferring mechanism is then withdrawn from the processing vessel 21 and the gate valve 26 is closed. Subsequently, by supplying a backside gas from a gas line 38, the wafer W is controlled to a predetermined temperature. Thereafter, the following steps are carried out.

Figure 4:
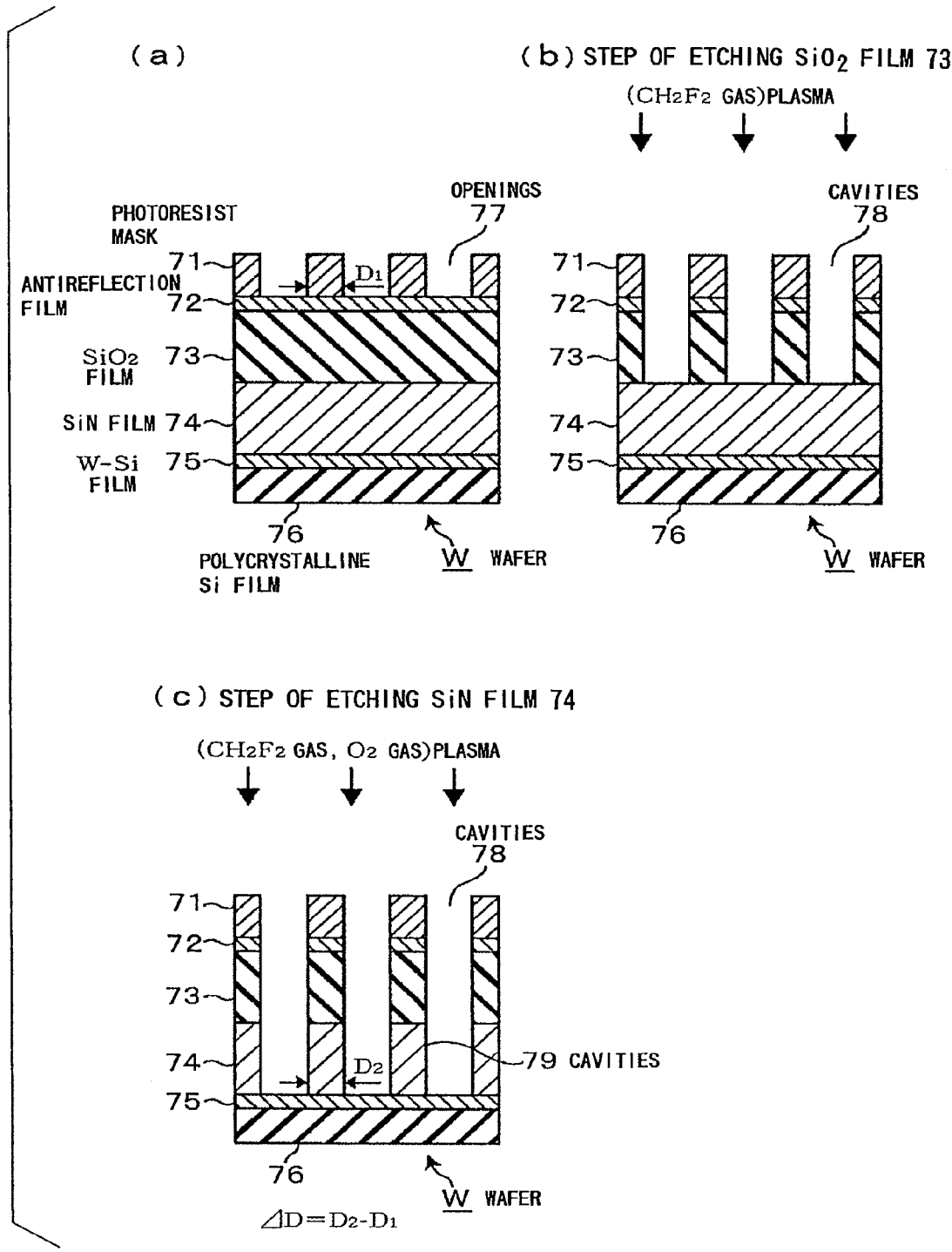
FIG. 4 (a) (b) (c) are views showing an example of the structure of a wafer W in plasma processing according to the present invention.

The structure of the surface of a wafer W is shown in FIG. 4(a). Polycrystalline Si film 76 is deposited on a transistor gate oxide film that is not shown in the figure, and on this film 76, W—Si (tungsten-silicon compound) film 75, SiN film 74, $SiO_2$ film 73, an antireflection film 72, and a photoresist mask 71 with openings 77 are deposited in the order mentioned. The W—Si film 75 and the polycrystalline Si film 76 are gate electrode materials, and the SiN film 74 serves as a hard mask when the gate electrode materials are etched into a line pattern to form a gate electrode.

(Step 1: Step of Etching Antireflection Film 72)

The processing vessel 21 is evacuated by the evacuation system 23 through the exhaust pipe 24 and is held at a predetermined degree of vacuum of e.g., 15.3 Pa (115 mTorr). For example, $CF_4$ gas, Ar gas, and $O_2$ gas are then supplied from the gas source M at flow rates of 120 sccm, 420 sccm, and 10 sccm, respectively. The pressure regulators 41a, 41b are controlled by the controller 2A so that the ratio of the pressure (flow rate) of the gases to be supplied to the gas feed pipe 42a to the pressure of the gases to be supplied to the gas feed pipe 42b becomes 45:55, for example.

Subsequently, a high-frequency wave with a frequency of 13.56 MHz and a power of 800 W is applied to the table 3, thereby producing a plasma from a gas mixture of the above-described gases. This plasma becomes dense when kept in the space above the wafer W by the magnetic field produced by the permanent magnets 27, 28.

This plasma contains active species of compounds consisting of hydrogen and fluorine, and when the antireflection film 72 is exposed to an atmosphere containing these active species, atoms present in this film react with the active species to give compounds, whereby the antireflection film 72 is etched.

(Step 2: Step of Etching $SiO_2$ Film 73)

Thereafter, the processing vessel 21 is evacuated by the evacuation system 23 through the exhaust pipe 24 and is held at a predetermined degree of vacuum of e.g., 13.3 Pa (100 mTorr). For example, $CH_2F_2$ gas, $CF_4$ gas, and Ar gas are then supplied from the gas source M at flow rates of 15 sccm, 100 sccm, and 600 sccm, respectively. The pressure regulators 41a, 41b are controlled by the controller 2A so that the ratio of the pressure (flow rate) of the gases to be supplied to the gas feed pipe 42a to the pressure of the gases to be supplied to the gas feed pipe 42b becomes 45:55, for example.

Subsequently, a high-frequency wave with a frequency of 13.56 MHz and a power of 1200 W is applied to the table 3, thereby generating plasma from a gas mixture of the above-described gases. This plasma becomes dense when kept in the space above the wafer W by the magnetic field produced by the permanent magnets 27, 28.

When the $SiO_2$ film 73 is exposed to active species of compounds consisting of carbon and fluorine, contained in the plasma, atoms present in this film react with the active species to give compounds, whereby the $SiO_2$ film 73 is etched to create cavities 78 in the film, as shown in FIG. 4(b).

(Step 3: Step of Etching SiN Film 74)

The processing vessel 21 is evacuated by the evacuation system 23 through the exhaust pipe 24 and is held at a predetermined degree of vacuum of e.g., 18.7 Pa (140 mTorr). For example, $CH_2F_2$ gas, $CF_4$ gas, Ar gas, and $O_2$ gas are then supplied from the gas source M at flow rates of 15 sccm, 80 sccm, 150 sccm, and 21 sccm, respectively. The pressure regulators 41a, 41b are controlled by the controller 2A so that the ratio of the pressure (flow rate) of the gases to be supplied to the gas feed pipe 42a to the pressure of the gases to be supplied to the gas feed pipe 42b (the ratio of the pressure of the gases to be supplied to the center section 53a to the pressure of the gases to be supplied to the edge section 53b) becomes 45:55, for example. And $CH_2F_2$ gas is further supplied from the gas source A at a flow rate of 5 sccm, for example.

Subsequently, a second high-frequency wave with a frequency of 13.56 MHz and a power of 700 W is applied to the table 3, thereby producing a plasma from the gases supplied to the processing vessel 21 from the gas sources M and A. This plasma becomes dense when kept in the space above the wafer W by the magnetic field produced by the permanent magnets 27, 28.

In this example, $CF_4$ gas and $O_2$ gas are etching gases, and $CH_2F_2$ gas is a depositing gas. In the plasma of these gases, the active species produced by the dissociation of $CF_4$ gas and oxygen active species act to etch the SiN film 74 to form therein cavities 78 (grooves), while the active species produced by the dissociation of $CH_2F_2$ gas deposit on the inner walls of the cavities 78. Owing to the actions of the two types of gases, the etching process progresses while restraining the increase in the openings of the cavities, as shown in FIG. 4(c). $O_2$ gas is for creating plasma with which the SiN film 74 is etched vertically to the wafer W.

In this process, since the processing vessel 21 is evacuated by the evacuation system 23, the gases supplied to the wafer W from the upper electrode 4 is more easily exhausted from the edge portion of the wafer W than from the center portion. In order to make up for this, the ratio of the flow rate of the gases to be supplied to the center section 53a to the flow rate of the gases to be supplied to the edge section 53b is set to 45:55, thereby making the gas flow rate per unit area greater in the edge section 53b than in the center section 53b. Further, as can be understood from the following Examples, the boundary between the center section 53a and the edge section 53b to which gases are supplied independently is optimized, and moreover, with consideration for the fact that gas pressure differences greatly affect the amount of a film to be deposited on the inner walls of cavities in SiN film 74, the area to which gases are supplied was divided into the center section 53a and the edge section 53b. Furthermore, since the gas pressure in the edge portion of a wafer W is low, $CH_2F_2$ gas, a depositing gas, is supplied from the edge section 53b as an additional gas. Consequently, the etching process progresses without making the sizes of the non-etched portions 79 in the center portion of a wafer W greater than the sizes of the non-etched portions 79 in the edge portion of the wafer W.

Thereafter, the photoresist mask 71 is removed by ashing, and after cleaning the wafer W, the W—Si film 75 and the polycrystalline Si film 76 are etched with the use of the $SiO_2$ film 73 and the SiN film 74 as a mask.

According to the above-described embodiment, the partition 55 useful for supplying gases to the center and edge portions of a wafer W separately is placed in an optimum position, and $CH_2F_2$ gas having the property of depositing on SiN film 74 is supplied to the edge portion 53b. As the following Examples show, therefore, lines uniform in width can be made not only in a densely-patterned area of the wafer W in which the ratio of metallic lines to insulation layers between them is about 1:1, but also in a non-densely-patterned area of the wafer W in which the above ratio is 1:2 or more.

In this example, $CH_2F_2$ gas is used as the gas from the gas source A to be added to the second gas, having the property of protecting the sides (side faces) of non-etched portions 79. The gas from the gas source A is not limited to $CH_2F_2$ gas, and a gas having the property of protecting the sides of non-etched portions 79, such as $N_2$ gas, or a gas containing carbon and hydrocarbon, having the property of depositing on the sides of the non-etched portions 79, such as $CH_3F$ gas, may also be used.

In the step of etching the SiN film 74, the wafer W generates $N_2$ gas as a reaction product, but this gas is exhausted by the evacuation system 23. The $N_2$ gas concentration, therefore, is lower in the edge portion Wb of the wafer W than in the center portion Wa. With consideration for this fact, $N_2$ gas is supplied to the edge portion Wb of the wafer W from the gas source A in order to make the $N_2$ gas distribution on the wafer W surface uniform. Consequently, the non-uniformity of the distribution of process gases supplied from the gas source M to the wafer W via the center section 53a and the edge section 53b can be decreased, and the non-etched portions 79 of the wafer W thus become uniform in size. Since $N_2$ gas produces no plasma species having an influence on SiN film 74 and does not adversely affect the plasma-processing of a wafer W, it may be used as a gas having the property of protecting the (side faces) of non-etched portions 79, as mentioned above.

On the other hand, the radius RO of the outermost circle of the gas-jetting pores 51 in the center section 53a is not limited to 80% of the radius of a wafer W. It can be known from the following Examples that the same effects can be obtained as long as the radius RO is not less than 53% of the radius of a wafer W. For example, when the radius RO is set to 53% of the radius of a wafer W with a diameter of 300 mm, the partition 55 is placed between the outer third and fourth circles of the gas-jetting pores 51.

The gas supply unit 1 of the present invention can make it possible to process a wafer uniformly because it is partitioned into the center section 53a and the edge section 53b in the above-described proportion, and an additional gas is supplied to a wafer from the edge section 53b. Therefore, when the present invention is applied also to SiN film 74, it is preferable to set the proportion of the center section 53a to the edge section 53b to a percentage in the above-described range. However, as far as SiN film 74 is concerned, it is not necessary that the proportion of the center section 53a to the edge section 53b be 53% or more, and even the novel technique alone, which a gas having the property of depositing on SiN film or of protecting the sides of non-etched portions of SiN film is supplied to the edge section 53b, can produce satisfactory effects as compared with conventional techniques.

In the case where a line pattern is made in a wafer W, a gas supplied to the wafer W flows along the pattern in the wafer, so that the gas distribution on the wafer W surface tends to be non-uniform as compared with the case where holes are made in a wafer W. However, as the following Examples show, even when a line pattern is made in a wafer W by etching, within-wafer variations in line size can be made small by the use of the plasma processing system 2 to which the gas supply unit 1 of the present invention is applied.

A system in which RF energy for making process gases into a plasma and another RF energy for drawing the plasma to a wafer W are applied to the upper electrode 4 and the table 3, respectively, may also be used as the plasma processing system for use in the present invention. Further, in the above-described example, the plasma is made dense by keeping it in the space above a wafer W by using the permanent magnets 27, 28, but it is not necessary to provide the permanent magnets 27, 28.

The gas supply unit 1 of the present invention can be applied not only to a plasma processing system 2, but also to a system for processing a substrate by supplying a process gas to the substrate, such as a CVD system.

Figure 6:
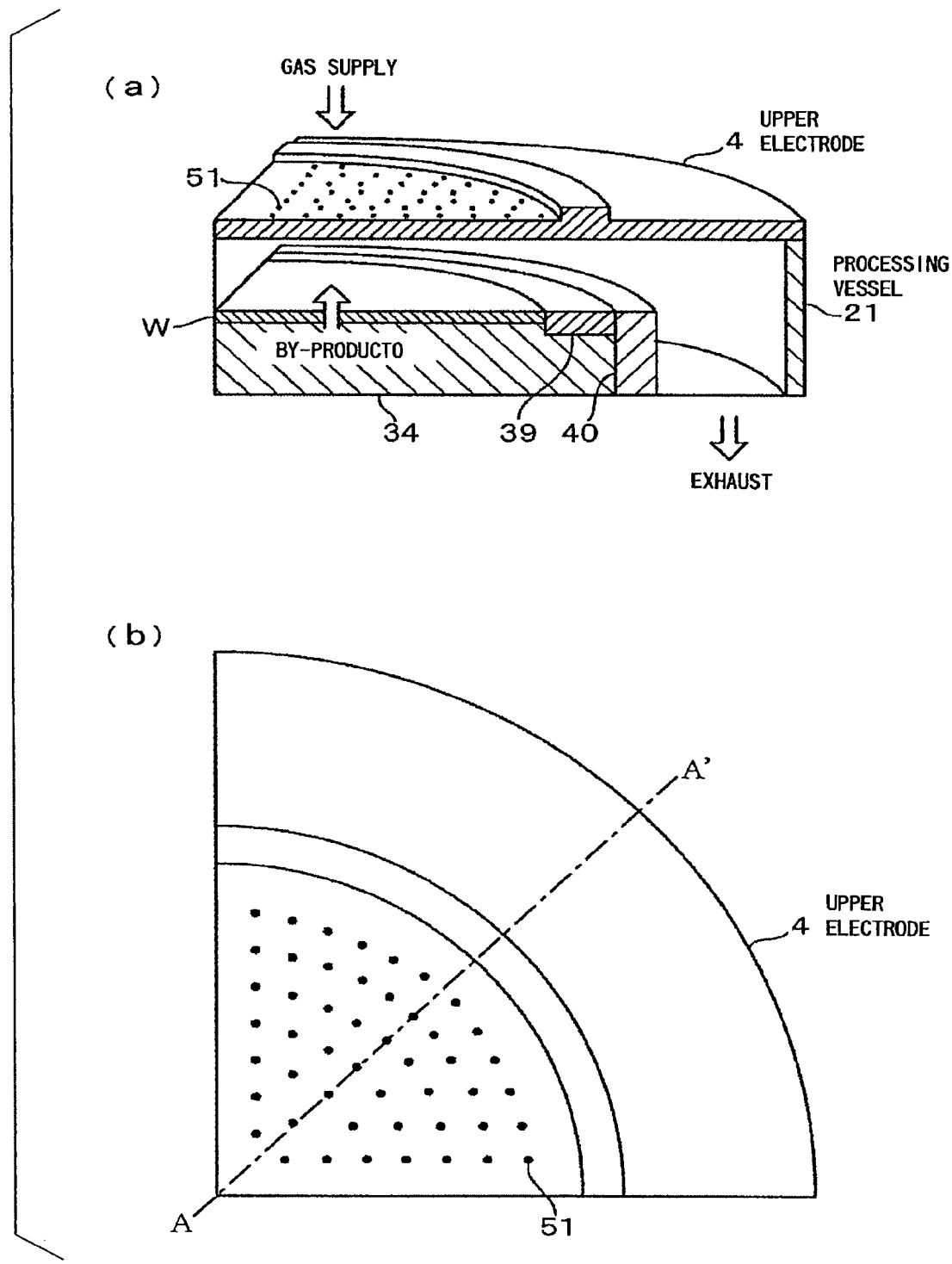
FIG. 6 (a) (b) are views showing a model of the processing vessel 21 used in Experimental Example 2.

Next, experiments and simulations that were carried out in order to find the optimum position of the outermost circle of the gas-jetting pores 51 communicating with the center section 53a of the upper electrode in the gas supply unit 1 of the present invention will be described hereinafter. In the following Experimental Examples, a plasma processing system 2 having the structure shown in FIGS. 1 to 3 was used to process a wafer W with a plasma. To simplify the process, the processing vessel 21 vertically cut up into four, as shown in FIG. 6, was used as a model in the simulations.

Figure 5:
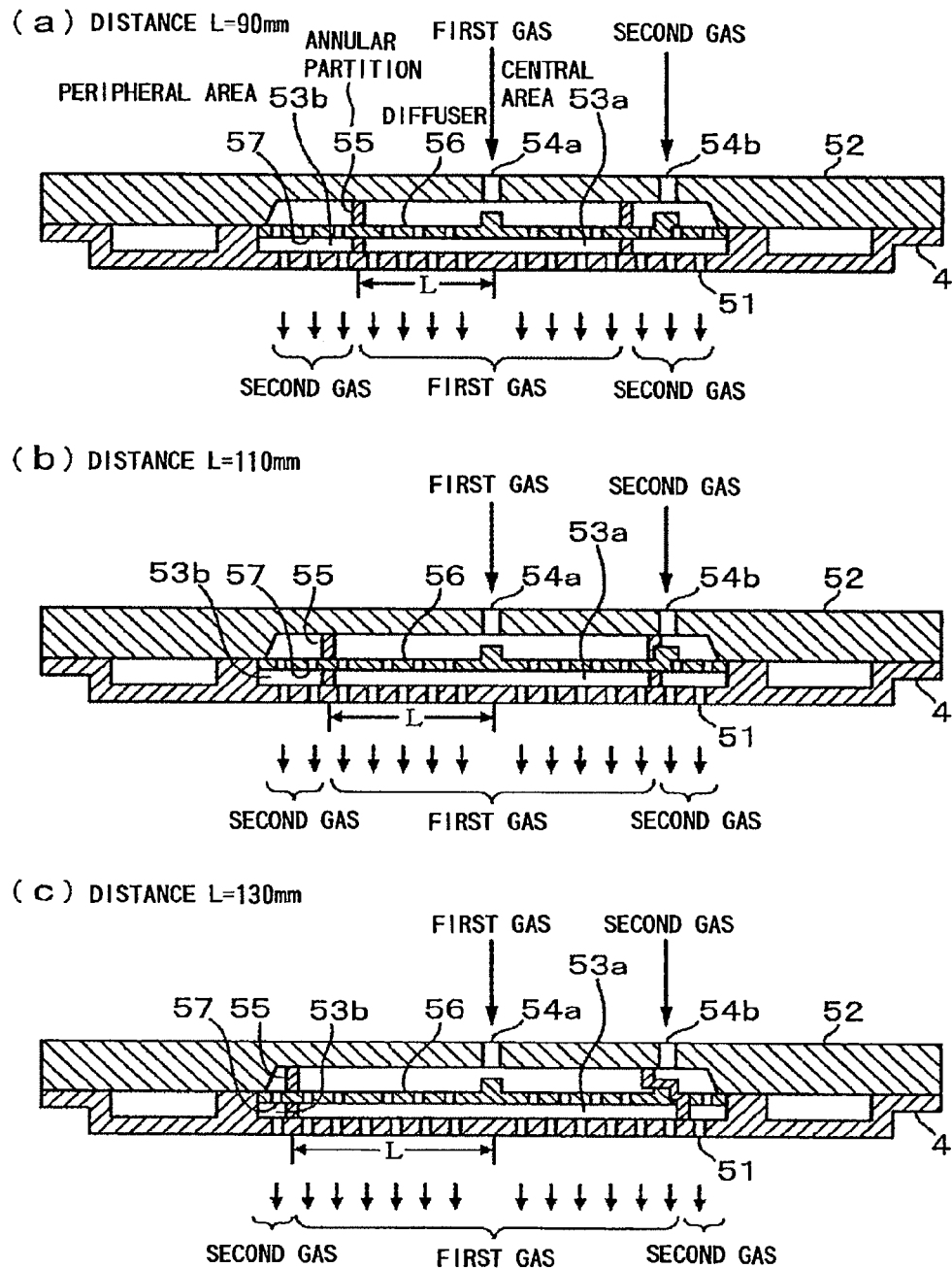
FIG. 5 (a) (b) (c) are views showing the position of a partition 55 in Experimental Example 2.

Experiments were carried out by placing the partition 55 in one of the following three positions, as shown in FIG. 5: the position at which the gas-jetting pores 51 made in the upper electrode 4 in seven concentric circular rows are divided into four inner and three outer circles of the gas jetting pores 51 (FIG. 5(a)); the position at which the gas-jetting pores 51 are divided into five inner and two outer circles of the gas-jetting pores 51 (FIG. 5(b)); and the position at which the gas-jetting pores 51 are divided into six inner and one outer circles of the gas-jetting pores 51 (FIG. 5(c)). Namely, the position of the partition 55 was set so that the radius of the outermost circle of the gas-jetting pores 51 communicating with the center section 53a was 53% of the radius of a wafer W (distance L from the center of the upper electrode 4 to the partition 55: 90 mm); that the radius of the outermost circle of the gas-jetting pores 51 communicating with the center section 53a was 67% of the radius of a wafer W (distance L: 110 mm); or that the radius of the outermost circle of the gas-jetting pores 51 communicating with the center section 53a was 80% of the radius of a wafer W (distance L: 130 mm).

Further, in order to obtain the data on SiN film 74, a wafer W having the structure shown in FIG. 4(a) was made into the state as shown in FIG. 4(b) by etching the antireflection film 72 and the SiO$_2$ film 73 under the following process conditions, and was used in the following Experimental Examples 1 and 3.
(Etching of Antireflection Film 72)
  Frequency of high-frequency wave: 13.56 MHz
  Power of high-frequency wave: 800 W
  Process pressure: 15.3 Pa (115 mTorr)
  Process gases (gas source M): CF$_4$/Ar/O$_2$=120/420/10 sccm
  Pressures of pressure regulators:
  pressure regulator 41a/pressure regulator 41b=45/55
  The partition 55 was placed in such a position that the distance L was equal to 130 mm.
(Etching of SiO$_2$ Film 73)
  Frequency of high-frequency wave: 13.56 MHz
  Power of high-frequency wave: 1200 W
  Process pressure: 13.3 Pa (100 mTorr)
  Process gases (gas source M): CH$_2$F$_2$/CF$_4$/Ar=15/100/600 sccm
  Pressures of pressure regulators:
  pressure regulator 41a/pressure regulator 41b=45/55
  The partition 55 was placed in the same position as the above.

Experimental Example 1

Etching Rate

Prior to carrying out simulations, an experiment for estimating the amount of a gas to be generated from the wafer W in the step of etching the SiN film 74 was carried out in order to determine more practical conditions. The SiN film 74 was etched under the following process conditions.
(Etching of SiN Film 74)
  Frequency of high-frequency wave: 13.56 MHz
  Power of high-frequency wave: 700 W
  Process pressure: 18.7 Pa (140 mTorr)
  Process gases (gas source M): CH$_2$F$_2$/CF$_4$/Ar/O$_2$=15/80/150/21 sccm
  Process gas (gas source A): CH$_2$F$_2$=5 sccm
  Pressures of pressure regulators:
  pressure regulator 41a/pressure regulator 41b=
  55/45 (distance L=90 mm),
  1/1 (distance L=110 mm), and
  45/55 (distance L=130 mm)
Results of Experiments The etching rates of the SiN film 74 determined in the above experiments are shown in Table 1.

TABLE 1

|  | Distance L (mm) | | |
| --- | --- | --- | --- |
|  | 90 | 110 | 130 |
| Etching Rate (nm) | 180.4 | 181.3 | 180.9 |
| Standard Deviation (%) | 1.8 | 1.4 | 1.9 |

From the data shown in Table 1, it was found that almost the same etching rate was obtained independently of the percentage of the radius of the outermost circle of the gas-jetting pores 51 communicating with the center section 53a to the radius of the wafer W (regardless of the distance L). Further, from the composition of the SiN film 74, as well as the type and flow rate of the gases to be supplied to the wafer W, it is expected that CN gas and SiF$_4$ gas will be mainly generated in the step of etching the SiN film 74. It is also expected from the etching rate of the SiN film 74 that the rate of gas generation will be 0.001 g/sec.

Experimental Example 2

Simulation

The gas distribution in the processing vessel 21 was simulated with the use of a fluid analysis soft, Fluent Vers. 6.2.16, manufactured by FLUENT Corp. The simulation was carried out on the assumption that gases are compressive fluids and that their flows are laminar. Further, calculations were made on the assumption that a gas causes slips in velocity and jumps in temperature on a solid surface such as a wafer W or upper electrode 4 surface.

The distance L from the center of the upper electrode 4 to the partition 55 was, as shown in FIG. 5, made 90 mm, 110 mm, or 130 mm so that the radius of the outermost circle of the gas-jetting pores 51 communicating with the center section 53a was 53%, 67%, or 80% of the radius of the wafer W, respectively.

The simulations were carried out under the same process conditions as in the above-described Experimental Example 1, except that the process pressure was set to the following three levels and that the gas flow rates were changed to the values as shown in Table 2.
(Process Conditions in Simulation)
  Process pressure: 8 Pa (60 mTorr), 13.3 Pa (100 mTorr), or 18.7 Pa (140 mTorr)

TABLE 2

| | | | 90 mm | | 110 mm | | 130 mm | |
|---|---|---|---|---|---|---|---|---|
| | Distance L | | First gas | Second gas | First gas | Second gas | First gas | Second gas |
| Gas flow rate (sccm) | Gas source M | CH2 F2 | 4.5 | 10.5 | 7.4 | 7.6 | 10.2 | 4.8 |
| | | CF4 | 24 | 56 | 40 | 40 | 54 | 26 |
| | | Ar | 45 | 105 | 74 | 76 | 102 | 48 |
| | | O2 | 6.4 | 14.6 | 10.4 | 10.6 | 14.3 | 6.7 |
| | Gas source A | CH2 F2 | 0 | 5 | 0 | 5 | 0 | 5 |
| Total | | | 79.9 | 191.1 | 131.8 | 139.2 | 180.5 | 90.5 |
| The number of gas-jetting pores 51 | | | 68 | 128 | 104 | 92 | 146 | 50 |

The upper electrode 4 used had gas-jetting pores 51 made in six concentric circular rows; the number of the gas-jetting pores 51 in the first (innermost) to sixth (outermost) row was 8, 12, 20, 36, 44, and 48, respectively. The number of the gas-jetting pores 51 in each row is also shown in Table 2.

In order to know the distribution of the first gas and that of the second gas separately, simulations were carried out by singly supplying the first and second gases. Further, with respect also to the gases from the gas sources M and A, contained in the second gas, simulations were carried out by singly supplying the gases, or by supplying, along with the first gas, one of the gases as the second gas. Simulation on the reaction product gas was also carried out.

Assuming that the wafer W will generate 25 wt. % of CN gas and 75 wt. % of $SiF_4$ gas while the wafer W is etched, and expecting from the etching rates obtained in Experimental Example 1 that the gases will be produced at a rate of 0.001 g/second, calculations were made. It was also assumed that the first gas, the second gas, and the gas generated from the wafer W were uniform mixtures of constituent gases Furthermore, the temperatures of various parts of the processing vessel 21 were measured and were used for the simulations. The temperatures measured are shown in Table 3.

TABLE 3

| | Temperature (° C.) |
|---|---|
| Second Ring 40 | 115 |
| Wafer W | 70 |
| Upper Electrode 4 | 60 |
| Inner Wall of Processing Chamber 21 | 60 |
| Sidewall of Table 3 | 115 |
| Electrostatic Chuck 34 | 60 |

The physical properties of the gases used in the simulations are shown in Table 4.

TABLE 4

| Gas species | Density (kg/m3) | Specific heat (J/(kgK)) | Thermal conductivity (w/(mK)) | Coefficient of viscosity | Molar weight |
|---|---|---|---|---|---|
| CH2F2 | The law of ideal gas was applied | 116.492 + 2.58851 × T + 0.0019696 × T2 | The kinematical theory was applied | The kinematical theory was applied | 0.052 |
| CF4 | The law of ideal gas was applied | 158.858 − 2.30219 × T − 0.00184652 × T2 | The kinematical theory was applied | The kinematical theory was applied | 0.088 |
| Ar | The law of ideal gas was applied | 520.64 | The kinematical theory was applied | The kinematical theory was applied | 0.04 |
| O2 | The law of ideal gas was applied | 878.491 − 0.000115007 × T + 0.000545659 × T2 | The kinematical theory was applied | The kinematical theory was applied | 0.032 |
| CN | The law of ideal gas was applied | 1043 | The kinematical theory was applied | The kinematical theory was applied | 0.026 |
| SiF4 | The law of ideal gas was applied | 257.81 + 2.07249 × T − 0.00211759 × T2 | The kinematical theory was applied | The kinematical theory was applied | 0.1041 |

Results of Experiments

Figure 7:
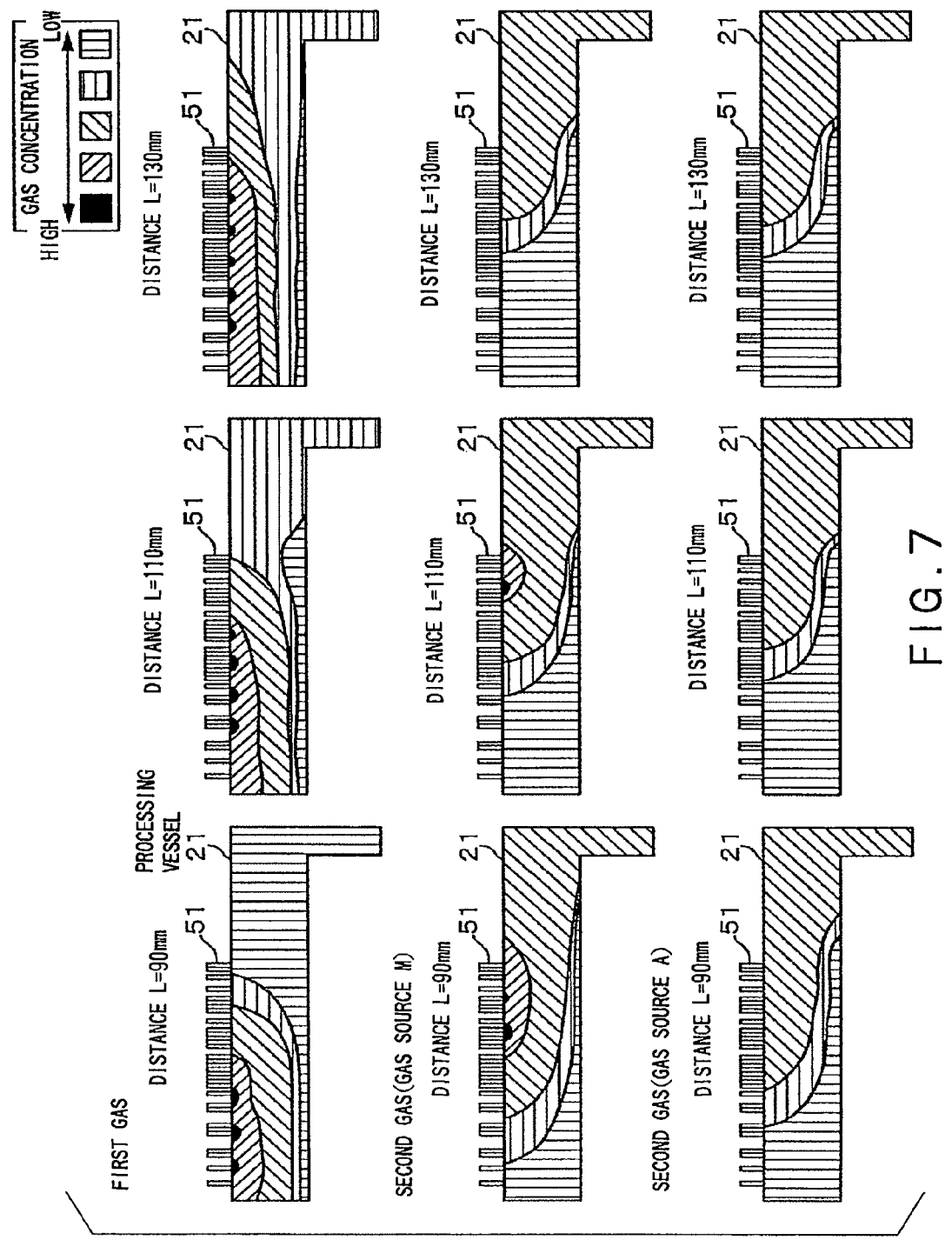
FIG. 7 is a view showing results of simulations carried out in Experimental Example 2.
Figure 8:
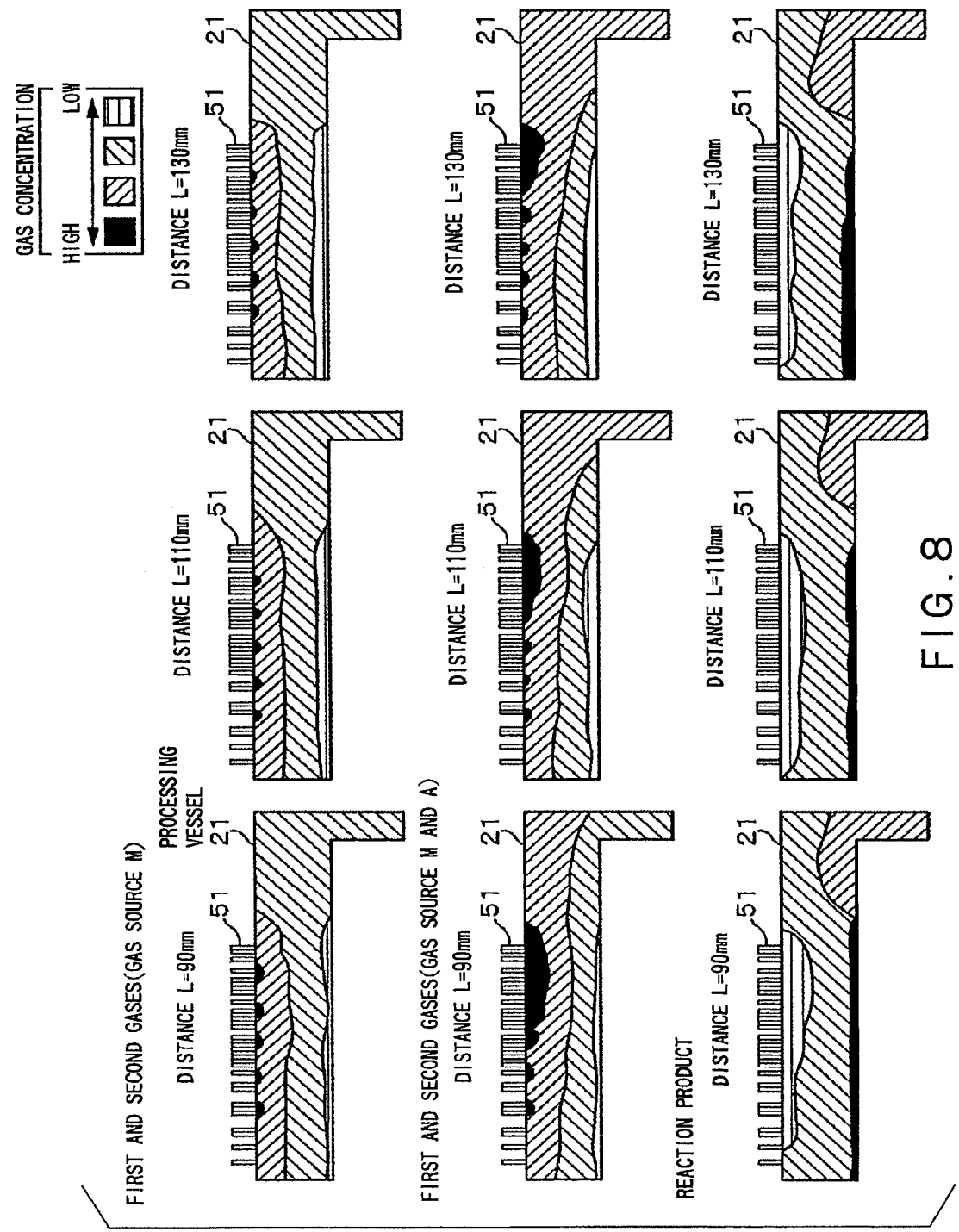
FIG. 8 is a view showing the results of simulations carried out in Experimental Example 2.

The gas concentration distributions in the processing vessel 21 at 18.7 Pa (140 mTorr), obtained from the simulations, are shown in FIGS. 7 and 8. FIGS. 7 and 8 are sectional views, taken along line A-A' in FIG. 6(b), showing the gas concentration distributions in the processing vessel 21.

The simulations have demonstrated the following: when a gas from the gas source M is supplied as the second gas to the first gas, the gas distribution on the wafer W surface becomes uniform, and if a gas from the gas source A is added to the second gas, the gas distribution becomes more uniform. Moreover, it was confirmed that, as the radius of the outermost circle of the gas-jetting pores 51 communicating with the center section 53a increases (as the distance L increases to 130 mm), the uniformity of gas concentration distribution on the wafer W surface increases.

Figure 9:
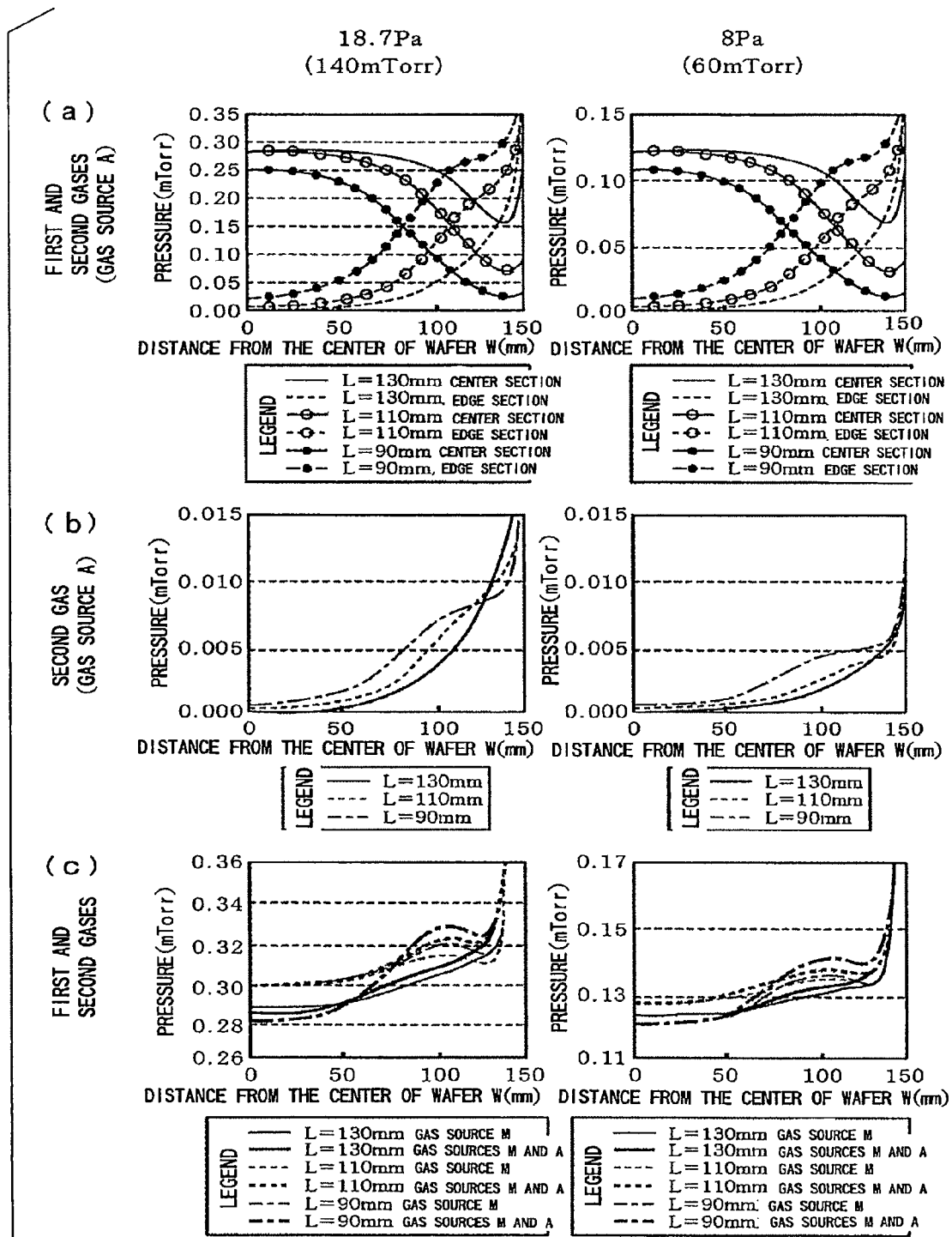
FIG. 9 (a) (b) (c) are views showing the results of simulations carried out in Experimental Example 2.

The above-described results obtained at 18.7 Pa (140 mTorr) and the results obtained at 8 Pa (60 mTorr) are graphed in FIG. 9, in which gas partial pressure is plotted vertically and distance L horizontally. The partial pressures plotted in the graphs were values measured at a point 0.5 mm above the wafer W surface.

The above-described results were confirmed by the graphs in FIG. 9. Further, it was found from FIG. 9(a) that even when no additional gas is supplied from the gas source A, as the radius of the outermost circle of the gas-jetting pores 51 communicating with the center section 53a increases (as the distance L increases to 130 mm), the influence of the second gas on the center portion of the wafer W lessens, i.e., the inclination of the graph in the edge portion of the wafer W becomes sharper. It was also found from FIG. 9(c) that even when no additional gas from the gas source A is supplied, the gas partial pressure distribution becomes uniform.

It was observed that the tendency in the above-described results was independent of pressure. It was, however, found that the non-uniformity of gas distribution decreases as pressure decreases. Further, although not shown in FIG. 9, simulation was carried out also at 13.3 Pa (100 mTorr). The results of this simulation were intermediate between the results obtained at 18.7 Pa (140 mTorr) and those obtained at 8 Pa (60 mTorr).

Experimental Example 3

Verification of Simulations

Experiments were carried out in order to verify the results of the simulations carried out in Experimental Example 2. In the experiments, the same processing process as in Experimental Example 1 was carried out, and the wafer W in the state as shown in FIG. 4(b) was etched. The process conditions used were the same as in Experimental Example 2, except for the following conditions.
(Process Conditions)
Distance L from the center of the upper electrode 4 to the partition 55: as described above
Process pressure: 18.7 Pa (140 mTorr)
Process gases (gas source M): as described above
Process gas (gas source A): as described above Experimental Example 3-1

The radius of the outermost circle of the gas-jetting pores 51 communicating with the center section 53a was made 80% of the radius of the wafer W (the distance L was made 130 mm). The flow rates of the process gases from the gas sources M and A were made as shown in the column "distance L=130 mm" of Table 2.

Experimental Example 3-2

The radius of the outermost circle of the gas-jetting pores 51 communicating with the center section 53a was made 53% of the radius of the wafer W (the distance L was made 90 mm). The flow rates of the process gases from the gas sources M and A were made as shown in the column "distance L=90 mm" of Table 2.

Experimental Example 3-3

Comparative Example

Figure 10:
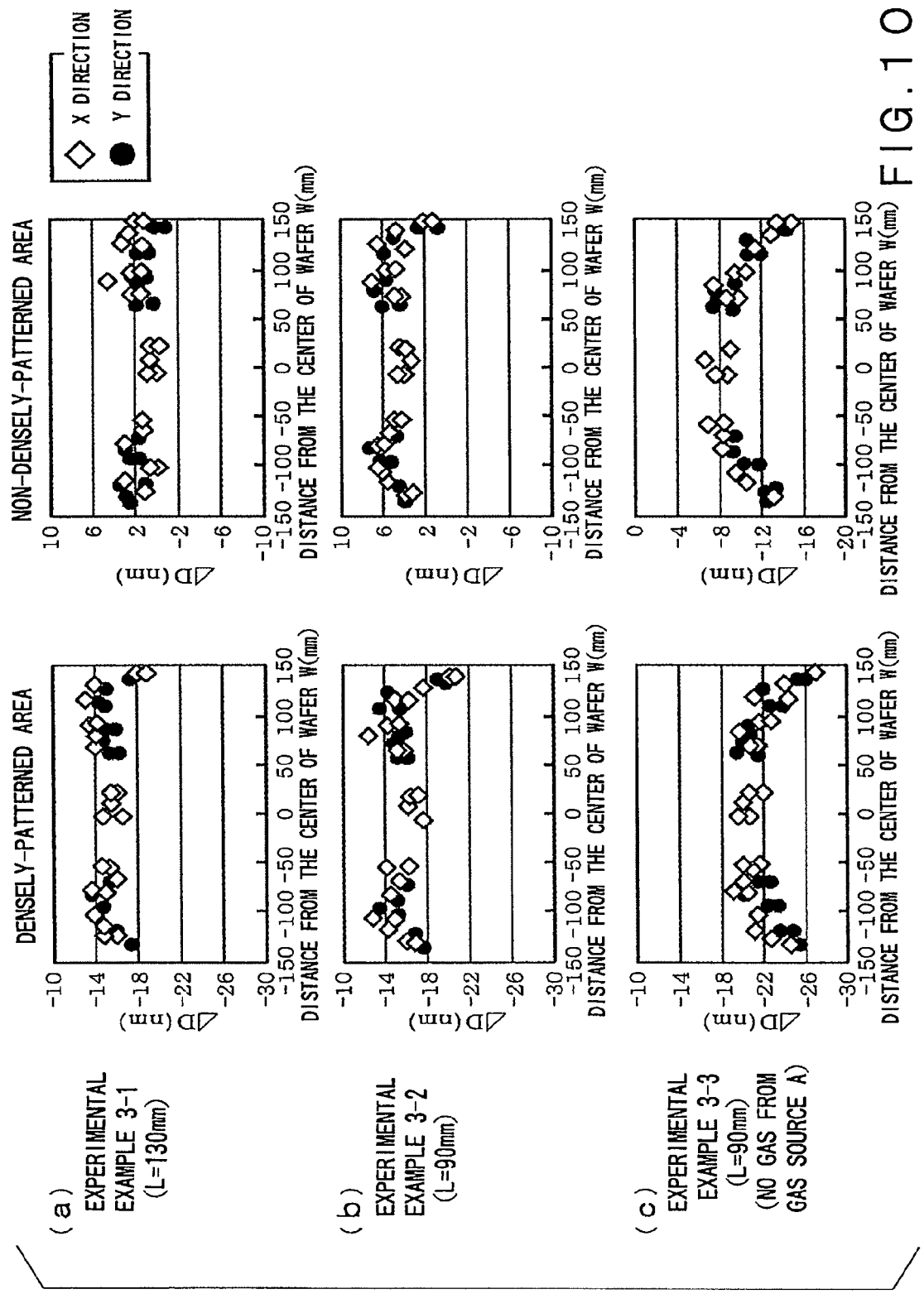
FIG. 10 (a) (b) (c) are views showing the results of experiments carried out in Experimental Example 3.
Figure 11:
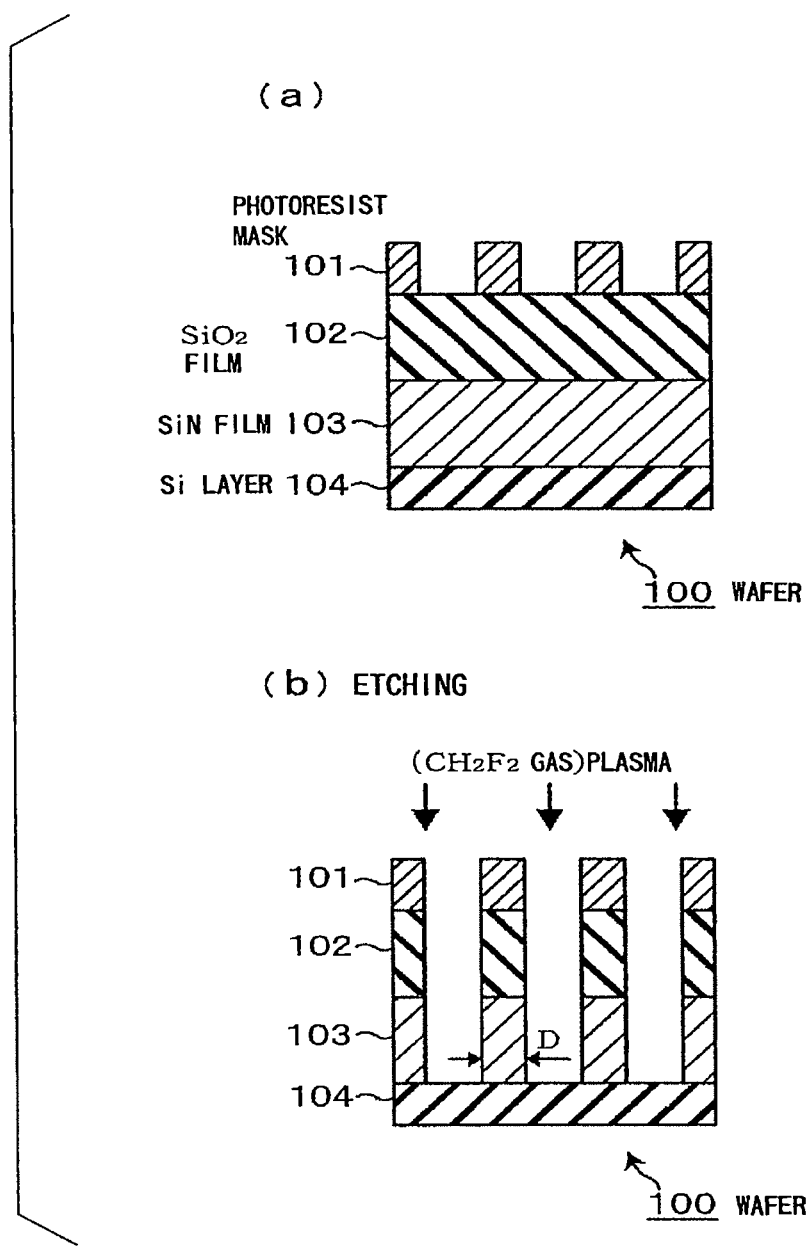
FIG. 11 (a) (b) are sectional views showing the structure of a wafer 100 in conventional plasma processing.

Experiments were carried out under the same conditions as in Experimental Example 3-2, except that the flow rate of the gas from the gas source A was made zero.
Results of Experiments In the densely- and non-densely-patterned areas of the wafer W, the size D1 of the non-etched portions of the photoresist mask 71 and the size D2 of the non-etched portions of the SiN film 74 (see FIG. 4) were measured in the X- and Y-directions of the wafer W, and ΔD (ΔD=D2− D1) was calculated and graphed in FIG. 10. As a result, it was found that, as the radius of the outermost circle of the gas-jetting pores 51 communicating with the center section 53a increases, the gas distribution becomes uniform, and variations in ΔD decrease not only in the densely-patterned area of the wafer W but also in the non-densely-patterned area. It was also found that the addition of the gas from the gas source A to the second gas improved the uniformity of ΔD. In Experimental Example 3-2, an abrupt rise in ΔD, which is considered to be the influence of the second gas, was observed at points about ±100 mm distant from the center of the wafer W, as shown in Experimental Example 2. However, the results obtained in Experimental Example 3-2 were better than those obtained in Experimental Example 3-3 (Comparative Example).

The invention claimed is:
1. A method of processing a substrate having a silicon nitride film thereon by the use of a substrate processing system comprising:
   a processing vessel,
   a table that is placed in the processing vessel and on which a substrate will be placed, and
   a gas supply unit set on the top of the processing vessel facing the table, the gas supply unit including a center section that corresponds to a center portion of the substrate and that has a plurality of gas-jetting pores, and a peripheral section that corresponds to a peripheral portion of the substrate and that has a plurality of gas-jetting pores,
   the method comprising the steps of:
   supplying to the substrate, from the center and peripheral sections of the gas supply unit, a common process gas at flow rates separately regulated,
   supplying, in addition to the common process gas, an additional gas from the peripheral section of the gas supply unit to the substrate peripheral portion, and
   evacuating the processing vessel, wherein
   the distance from the center of the center section of the gas supply unit to the outermost gas-jetting pores in the center section is 53%-80% of the radius of the substrate,
   the common process gas contains an etching gas and a gas having the property of depositing on the substrate and including a compound containing carbon and hydrogen, and
   the additional gas is a gas of a compound having a property of depositing on the substrate and containing carbon and hydrogen or nitrogen gas having the property of protecting side faces of projections on the substrate.

2. The method of substrate processing according to claim 1, wherein the step of supplying the common process gas from the center and peripheral sections of the gas supply unit is a step in which plural gases supplied from a plurality of gas supply sources are mixed, and the gas mixture is divided into two streams and supplied as the common process gas from the center and peripheral sections separately.

3. The method of substrate processing according to claim 1, wherein the ratio of the flow rate of the common process gas to that of the additional gas in the center section is the same as said ratio in the peripheral section.

4. The method of substrate processing according to claim 3, wherein the additional gas having the property of protecting the side faces of the projections is nitrogen gas.

5. The method of substrate processing according to claim 1, wherein the etching gas is for etching the silicon nitride film on the substrate.

6. The method of substrate processing according to claim 1, wherein the method makes lines in a thin film on the substrate by etching.

7. The method of substrate processing according to claim 1, wherein the pressure at which the substrate is processed in the processing vessel is regulated to 1.3-40 Pa.

* * * * *